(12) United States Patent
Brophy et al.

(10) Patent No.: US 6,683,468 B1
(45) Date of Patent: Jan. 27, 2004

(54) METHOD AND APPARATUS FOR COUPLING TO A DEVICE PACKAGED USING A BALL GRID ARRAY

(75) Inventors: Brenor L. Brophy, San Jose, CA (US); James H. Lie, San Jose, CA (US); Andrew J. Wright, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 75 days.

(21) Appl. No.: 09/942,436

(22) Filed: Aug. 29, 2001

(51) Int. Cl.[7] .............................................. G01R 31/02
(52) U.S. Cl. ........................................ 324/763; 324/765
(58) Field of Search .............................. 324/754–755, 324/761–763, 765; 257/667, 669, 697, 698, 684, 738, 780; 29/874, 876, 836; 361/704, 760–761, 764, 767, 774

(56) References Cited

U.S. PATENT DOCUMENTS

| | | | | |
|---|---|---|---|---|
| 5,334,857 A | * | 8/1994 | Mennitt et al. ............... 257/48 |
| 5,731,709 A | * | 3/1998 | Pastore et al. ............... 324/760 |
| 5,796,163 A | * | 8/1998 | Glenn et al. ................. 257/698 |
| 5,973,337 A | * | 10/1999 | Knapp et al. ................. 257/99 |
| 5,986,460 A | * | 11/1999 | Kawakami ................... 324/765 |
| 6,486,537 B1 | * | 11/2002 | Liebhard ..................... 257/667 |

* cited by examiner

*Primary Examiner*—Kamand Cuneo
*Assistant Examiner*—Minh N. Tang
(74) *Attorney, Agent, or Firm*—Wagner, Murabito, & Hao LLP (57) ABSTRACT

A ball grid array (BGA) package is disclosed. An interconnect structure is formed on a substrate that electrically connects the electrical device to be housed in the BGA package to the solder balls thereon. Contact pads are formed over the top surface of the substrate. These contact pads electrically connect to the interconnect structure. A layer of solder mask is formed over the substrate that includes openings that overlie the contact pads. The BGA is then completed using conventional process steps. Thereby, a BGA package is formed that includes contact pads disposed such that the contact pads are accessible from the top of the BGA package, making these contact pads easily accessible. Thus, when the BGA is attached to a circuit board, connection to circuits of the electrical device is obtainable.

20 Claims, 12 Drawing Sheets

METHOD AND APPARATUS FOR COUPLING TO A DEVICE PACKAGED USING A BALL GRID ARRAY

BACKGROUND OF THE INVENTION

1. Field of the Invention

The present invention relates to the field of packaging of electrical devices. More particularly, the present invention is a method and apparatus for packaging an electrical device.

2. Related Art

Ball grid array packages are commonly used for connecting semiconductor devices to a printed circuit board. Ball grid array packages include a substrate on which a conductive pattern is printed. Typically the conductive traces extend across the full length of the top surface of the substrate. The conductive pattern includes bonding pads that connect to conductive traces. The conductive traces electrically connect to bonding pads located on the bottom of the substrate.

Solder mask is then deposited, masked and etched such that the layer of solder mask covers the entire top surface of the substrate except for the bonding pads. In some prior art processes, a hard protective layer is deposited over the bonding pads so that there is a sufficiently hard surface for wire bonding.

The electrical device to be packaged (e.g., a semiconductor device) is placed over the substrate and a wire bonding process is performed. The wire bonding process electrically connects contacts on the semiconductor device with corresponding bonding pads on the surface of the substrate. A cover is then formed over the top of the structure that covers the semiconductor device and the bonding pads. The substrate is then trimmed. This is usually done by cutting off the edges of the substrate on all four sides.

Conductive balls, typically referred to as solder balls, are formed over the bottom surface of the substrate. The solder balls electrically connect to the bonding pads on the bottom of the substrate, and are thereby electrically connected to the semiconductor device.

Ball grid array packages are usually disposed over an array of contact pads printed on a printed circuit board and heat is applied such that the solder balls adhere to the array of contact pads. Once the solder cools, the ball grid array package is mechanically and electrically coupled to the printed circuit board.

The use of ball grid array packages is quite effective for mechanically and electrically connecting semiconductor devices to a printed circuit board. However, the use of ball grid array packages makes testing or "debugging" of the semiconductor device difficult. More particularly, because the connections between the ball grid array package and the circuitry of the circuit board are under the ball grid array substrate, they cannot be reached for the purpose of testing.

Some prior art printed circuit boards include test pins that are electrically connected to the solder balls that extend from the printed circuit board. However, at higher frequencies, these pins act as antennas, causing signal degradation (e.g. reflections, impedance mismatches, etc.) This is particularly true with respect to high performance data communication signals (e.g. data communication signals over 5 gigaHertz).

Often, the circuits of the semiconductor device are tested by connecting a testing probe (e.g., an oscilloscope or voltage meter) to leads of other devices that are electrically connected to the ball grid array device. However, this technique requires that there be other devices that are not ball grid array devices that include exposed leads. At high frequencies, devices that have exposed leads cannot be used because of the effects of signal degradation. For example, at frequencies above 5 gHz packages that have leads cannot be used as they have unacceptably high signal degradation.

What is needed is a method and apparatus that allows for testing of the circuits of a device that is packaged using a ball grid array package. In addition, a method and apparatus is needed that meets the above need and that is effective at high frequencies. Moreover, a method and apparatus is needed that meets the above needs and that does not contribute to signal degradation.

SUMMARY OF THE INVENTION

A method and apparatus is disclosed that allows for testing of the circuits of a device that is packaged using a ball grid array package. In addition, a method and apparatus is disclosed that meets the above need and that is effective at high frequencies. Moreover, a method and apparatus are disclosed that meets the above needs and that does not contribute to signal degradation.

In one embodiment of the present invention, a method for forming a ball grid array package is disclosed for containing a semiconductor device. First, an interconnect structure is formed on a substrate. The interconnect structure electrically connects the device to be housed in the ball grid array package to the solder balls of the ball grid array. In the present embodiment the interconnect structure includes bonding pads formed on both the top of the substrate and on the bottom of the substrate. The interconnect structure also includes traces and interconnects that electrically couple the bonding pads on the top of the substrate to the bonding pads on the bottom of the substrate.

Contact pads are formed over the top surface of the substrate. These contact pads electrically connect to the interconnect structure. In the present embodiment, the contact pads are formed during the previous step of forming an interconnect structure. More particularly, the contact pads are formed during deposition and etch steps that form the bonding pads and the traces on the top surface of the substrate.

A non-conducting layer is formed over the substrate that includes openings that overlie the contact pads and openings that overlie the bonding pads. In the present embodiment, the non-conducting layer is solder mask material.

The ball grid array is then completed using conventional process steps. In the present embodiment, the ball grid array is completed by forming a housing over the top of the substrate, trimming the substrate and forming solder balls on the bottom surface of the substrate. Thereby, a ball grid array package is formed having solder balls that are electrically coupled to the electrical device housed within the ball grid array package.

The ball grid array package can then be attached to a circuit board. In the present embodiment, the ball grid array package is attached to the circuit board by heating the solder balls such that the solder balls adhere to corresponding bonding pads located on the circuit board.

The contact pads of the ball grid array package of the present invention are exposed through the solder mask. Therefore, these contact pads are easily accessible as they are exposed on the top of the ball grid array package. Thus, even when the ball grid array is attached to a circuit board, connection with the circuits of the enclosed electrical device can be obtained.

Testing can be easily accomplished while the ball grid array package of the present invention is attached to the circuit board via contact with the exposed contact pads. More particularly, an electrical testing device can touch the contact pads for testing the enclosed electrical device.

The exposed contact pads could also be used for coupling to an overlying device or devices. This can be accomplished by disposing a device over the ball grid array package and by making electrical contact via the exposed contact pads. In addition, the exposed contact pads could be used for electrically coupling to devices that do not overlie the ball grid array package.

Because the ball grid array package of the present invention allows for easy testing via the exposed contact pads in the top of ball grid array package, there is no need to form test pins that extend from the printed circuit board as is required in some prior art applications. Therefore, there are no pins that act as antennas, and no corresponding signal degradation (e.g. reflections, impedance mismatches, etc.) as occurs with prior art devices.

In addition, because the ball grid array package of the present invention allows for easy testing via the exposed contact pads in the top of ball grid array package, there is no need for connecting a testing probe (e.g., an oscilloscope or voltage meter) to leads of other devices (that are electrically connected to the ball grid array) for testing the circuits of the electrical device disposed in the ball grid array package. Therefore, there is no need to include devices with leads in a circuit board design for the purpose of testing an electrical device housed in a ball grid array package as is required in some prior art applications.

Moreover, because the ball grid array package of the present invention allows for easy testing via the exposed contact pads in the top of ball grid array package, circuit boards can be easily designed for high performance data communication. More particularly, ball grid array packages can be included in the circuit board design and prior art features that provide for testing can be eliminated (e.g., test pins that extend from the printed circuit board and devices that include accessible leads), producing a circuit board design that can provide high performance data communication (e.g. data communication signals over 5 gigaHertz (gHz)).

Additionally, the methods of the present invention do not require any additional process steps as compared to prior art ball grid array manufacturing methods. More particularly, contact pads are formed during the conventional step of forming bonding pads and traces on the top of the substrate. Openings that extend above the contact pads are formed in the solder mask during the conventional step of forming openings to expose the bonding pads. Therefore, the methods and apparatus of the present invention provide for connectivity to the enclosed electronic device while not requiring additional process steps as compared to prior art processes. Therefore, the ball grid array housing of the present invention is easily and inexpensively manufactured.

Accordingly, the method and apparatus of the present invention allows for testing of the circuits of a device that is packaged using a ball grid array package. In addition, the method and apparatus of the present invention is effective at high frequencies. Moreover the method and apparatus of the present invention do not contribute to signal degradation.

DETAILED DESCRIPTION OF THE INVENTION

In the following detailed description of the present invention, a ball grid array package and a method for forming a ball grid array package, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Figure 1:
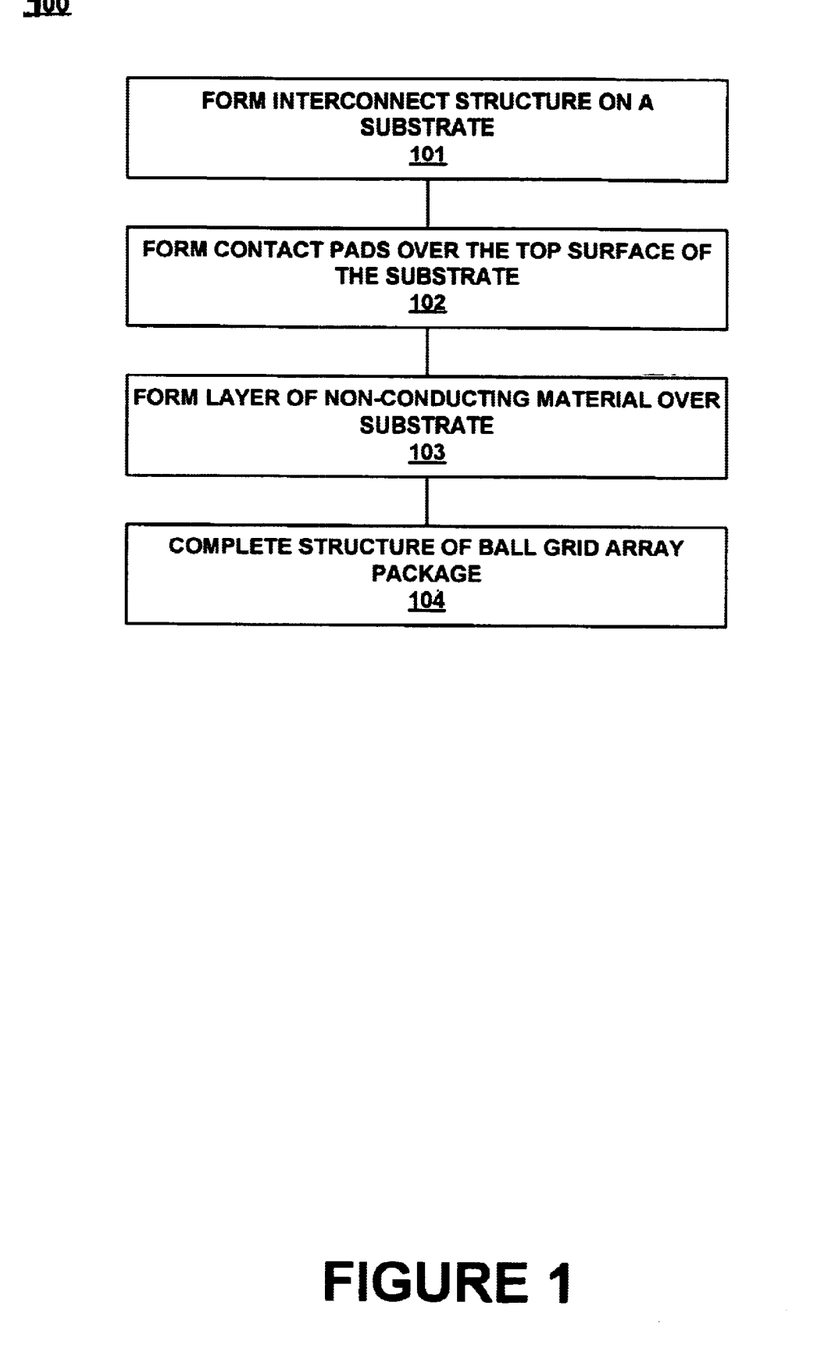
FIG. 1 is a flow diagram of a method for forming a ball grid array package in accordance with an embodiment of the present invention.

FIG. 1 shows a method 100 for forming a ball grid array package for containing a semiconductor device in accordance with one embodiment of the present invention. First, an interconnect structure is formed on a substrate as is shown by step 101. The interconnect structure electrically connects the device to be housed in the ball grid array package to the solder balls of the ball grid array.

Continuing with FIG. 1, as shown by step 102, contact pads are formed over the top surface of the substrate. The contact pads electrically connect to the interconnect structure. In the present embodiment, step 102 is performed contemporaneously with step 101. More particularly, the contact pads are formed during the formation of the interconnect structure.

A non-conducting layer is formed over the substrate as shown by step 103. In the present embodiment, the non-conducting layer is solder mask material that includes openings that overlie the contact pads. In the present embodiment, the layer of solder mask is deposited and is masked and etched to form openings that overlie the contact pads. The layer of solder mask may also be formed by first masking the openings, depositing a layer of solder mask over the entire area and then removing the masking material from the openings.

As shown by step 104, the ball grid array is completed. In the present embodiment, the ball grid array is completed using the conventional steps of forming a housing over the top of the substrate, trimming the substrate and forming conductive balls, on the bottom surface of the substrate. Thereby, a ball grid array package is formed having conductive balls that are electrically coupled to the electrical device housed within the ball grid array package.

Figure 2:
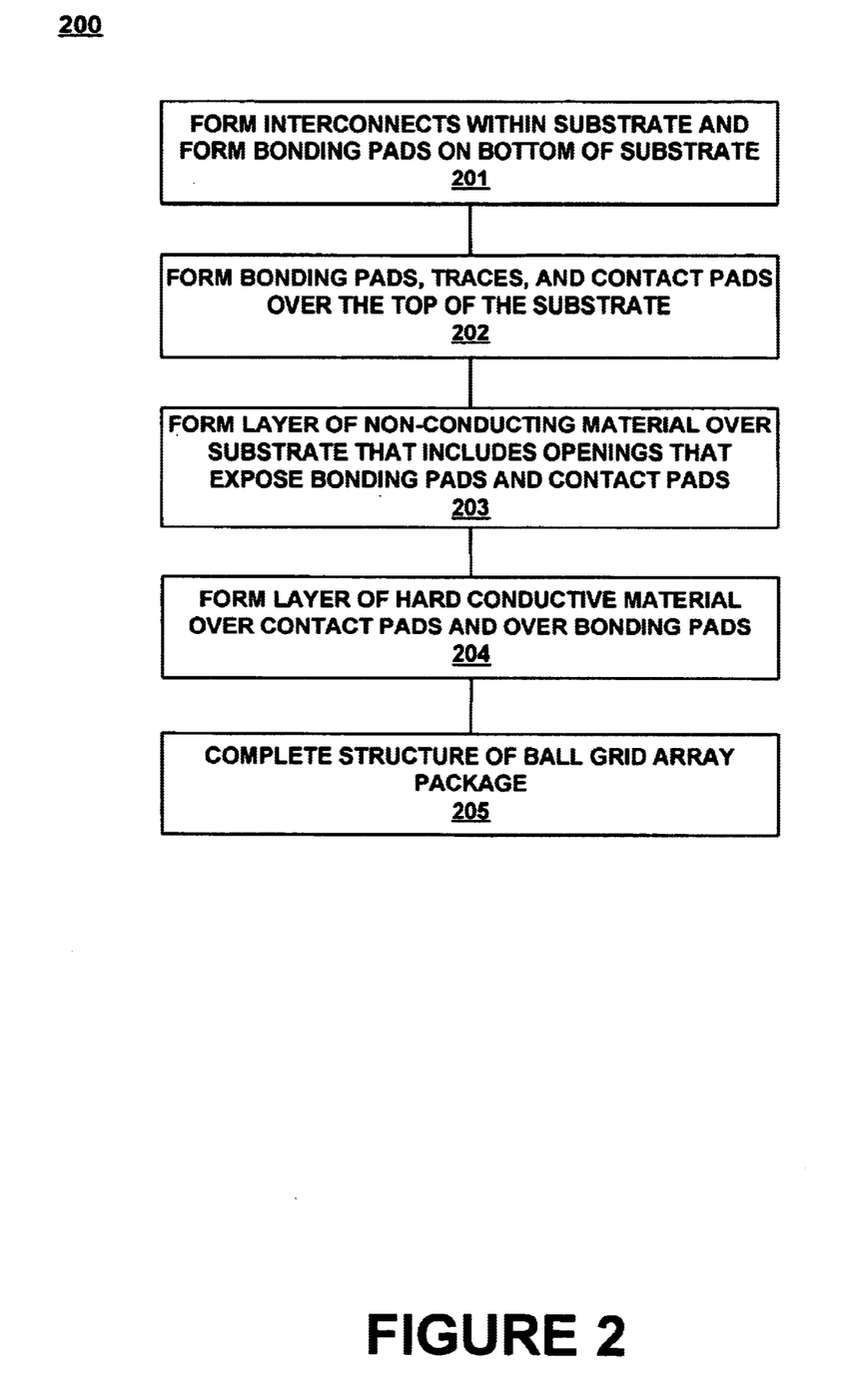
FIG. 2 is a flow diagram of a more detailed method for forming a ball grid array package in accordance with an embodiment of the present invention.
Figure 3:
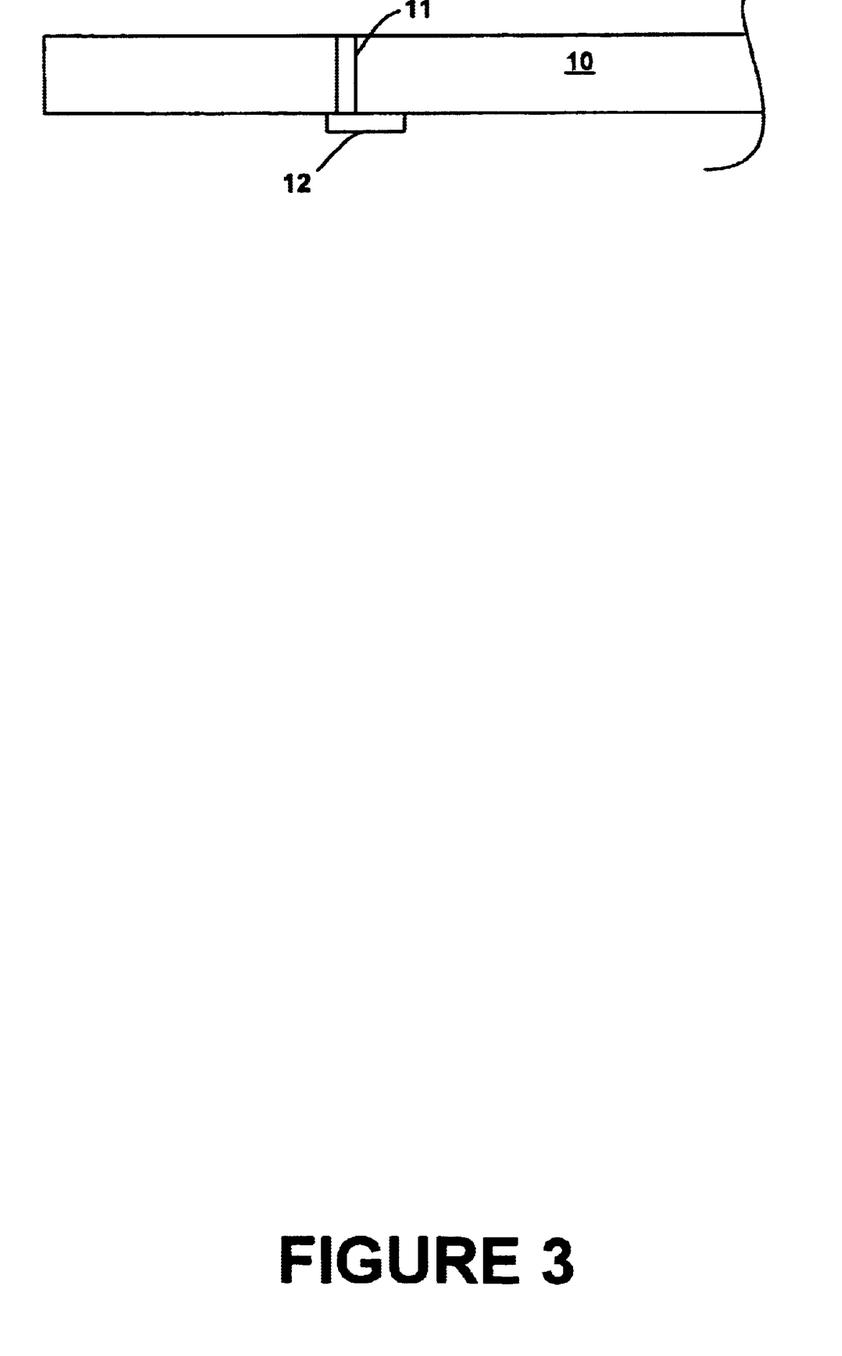
FIG. 3 is a side cross-sectional cut-away view of a portion of a substrate on which an interconnect and a bonding pad have been formed in accordance with an embodiment of the present invention.

FIG. 2 shows a more detailed method 200 for forming a ball grid array package in accordance with one embodiment of the present invention. First, interconnects are formed within a substrate and bonding pads are formed on the bottom surface of the substrate as is shown by step 201. FIG. 3 shows an exemplary cut-away view of a portion of a substrate 10 after an interconnect 11 has been formed therethrough and after bonding pad 12 has been formed. Any of a number of known methods can be used to form interconnect 11 and bonding pad 12. In one embodiment of the present invention, a layer of copper is deposited, masked and etched to form interconnect 11 and bonding pad 12.

Figure 4:
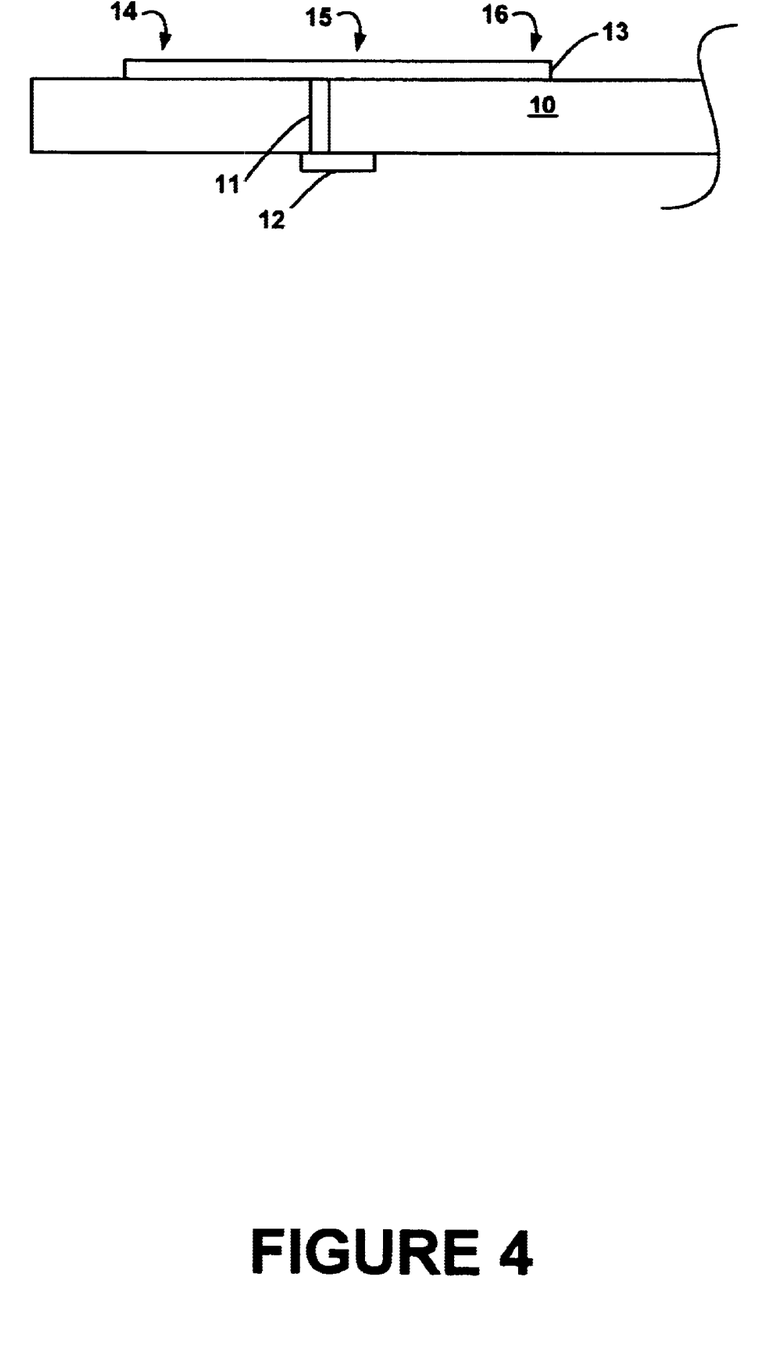
FIG. 4 is a side cross-sectional cut-away view of the structure of FIG. 3 after an exemplary bonding pad, contact pad and trace have been formed thereover in accordance with an embodiment of the present invention.

Referring now to step 202 of FIG. 2, bonding pads, traces and contact pads are formed over the top of the substrate. In the present embodiment, a layer of conductive material is deposited, masked and etched to form bonding pads, traces and contact pads. FIG. 4 shows a cut-away view of a portion of a substrate 10 after a layer of conductive material has been deposited, masked and etched to form conductive layer 13. In the present embodiment, copper is used to form conductive layer 13. However, conductive layer 13 could be made from other conductive materials such as, for example, gold, silver, etc.

Figure 5:
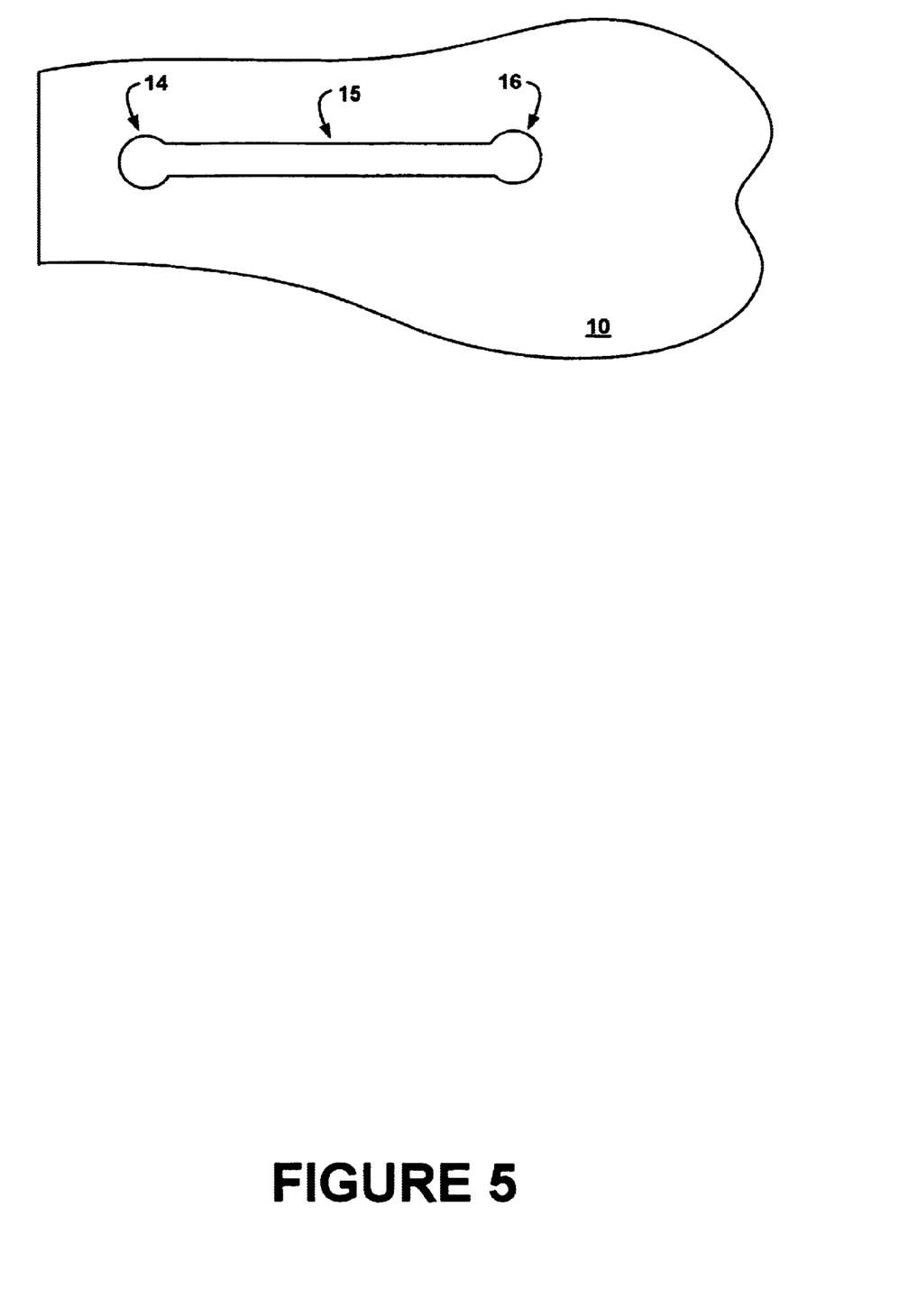
FIG. 5 is a top view of the structure of FIG. 4 in accordance with an embodiment of the present invention.

Referring now to FIGS. 4–5 it can be seen that bonding pad 16, contact pad 14 and trace 15 are formed within conductive layer 13. Bonding pad 16 is electrically connected with contact pad 14 by trace 15. Bonding pad 16 is electrically coupled with bonding pad 12 via trace 15 and interconnect 11.

Figure 6:
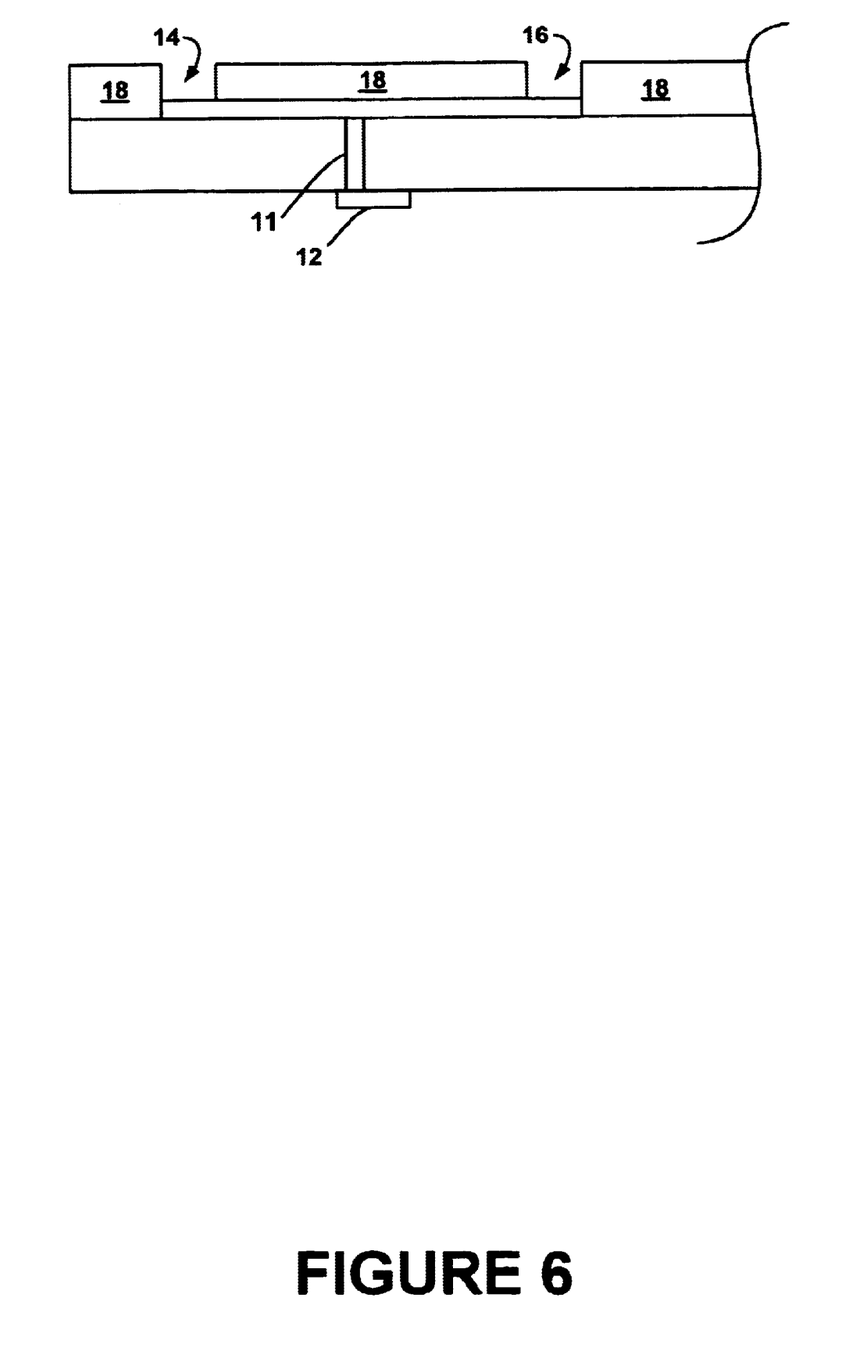
FIG. 6 is a side cross-sectional cut-away view of the structure of FIG. 4 after a non-conducting layer has been formed thereover that includes openings that extend over the bonding pads and openings that extend over the contact pads in accordance with an embodiment of the present invention.
Figure 7:
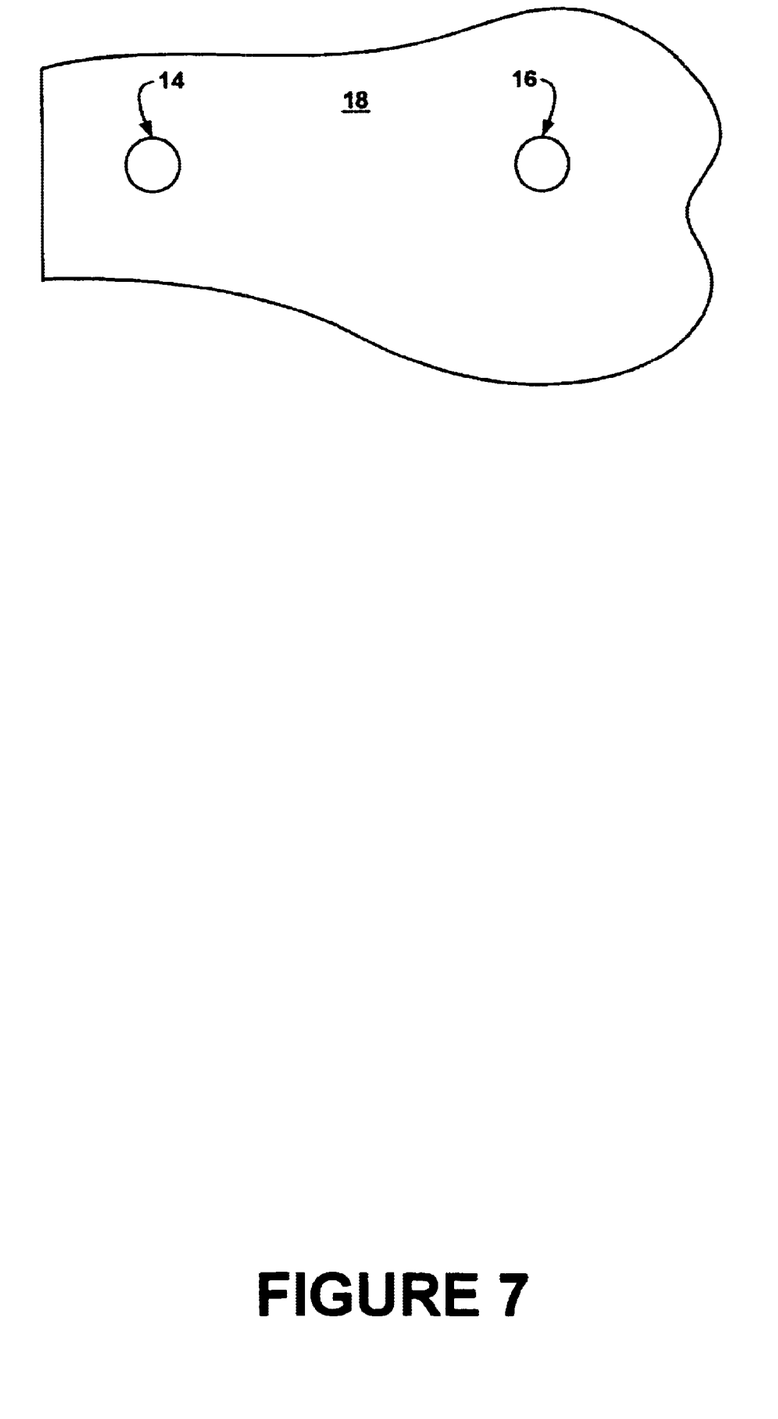
FIG. 7 is a top view of the structure of FIG. 6 in accordance with an embodiment of the present invention.

Referring back to FIG. 2, as shown by step 203, a layer of non-conducting material is formed over substrate 10 that includes openings that expose bonding pads and contact pads. In the present embodiment, the layer of non-conducting material is solder mask. In the present embodiment, the solder mask is a plastic material. However, other non-conducting materials could also be used. FIGS. 6–7 show an embodiment in which the non-conducting layer is formed of solder mask (solder mask layer 18). It can be seen that solder mask layer 18 includes an opening that overlies contact pad 14 so as to expose contact pad 14. Solder mask layer 18 also includes an opening that overlies bonding pad 16 so as to expose bonding pad 16 therethrough.

Figure 8:
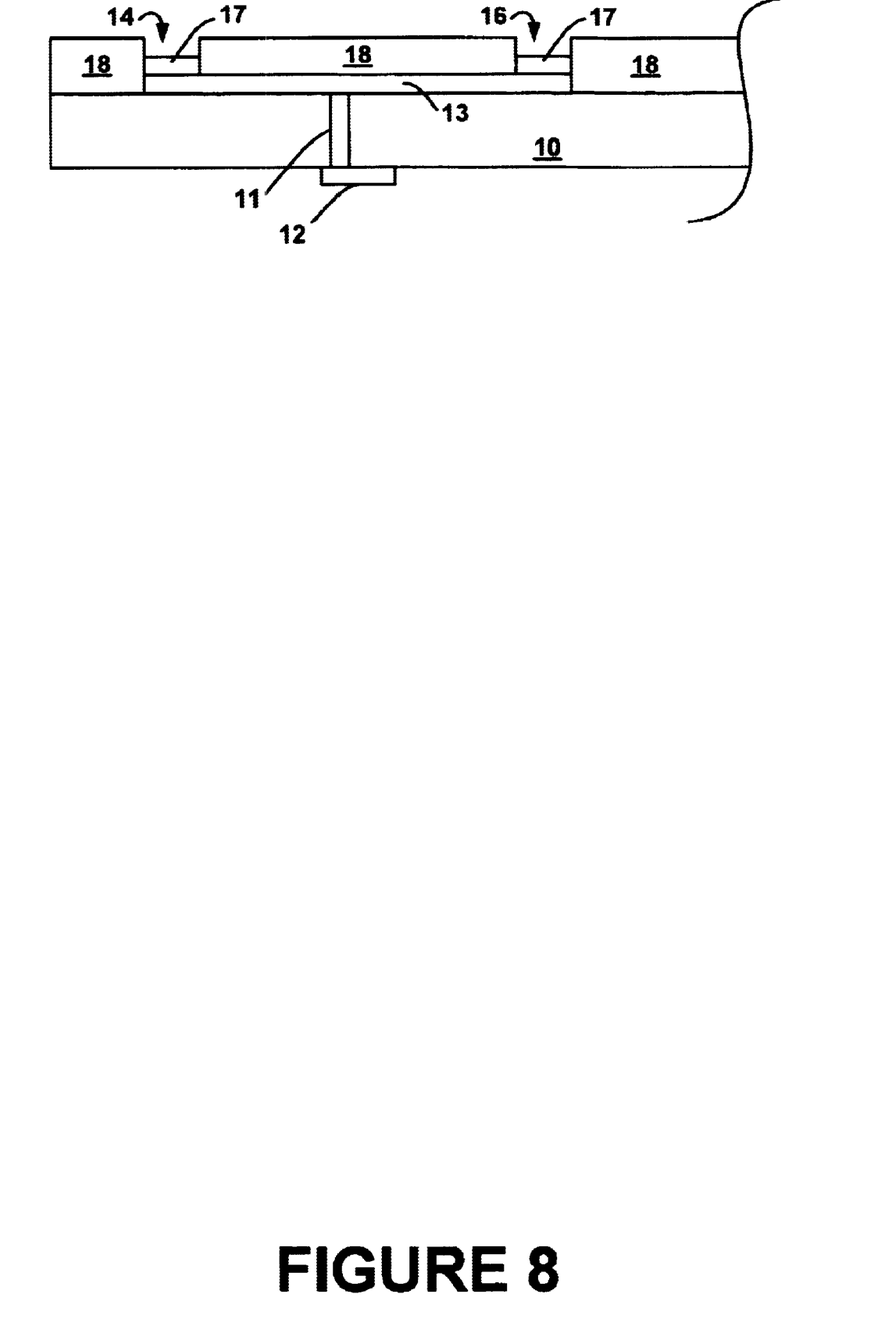
FIG. 8 is a side cross-sectional cut-away view of the structure of FIG. 6 after formation of a hard protective layer that covers bonding pads and contact pads in accordance with an embodiment of the present invention.
Figure 9:
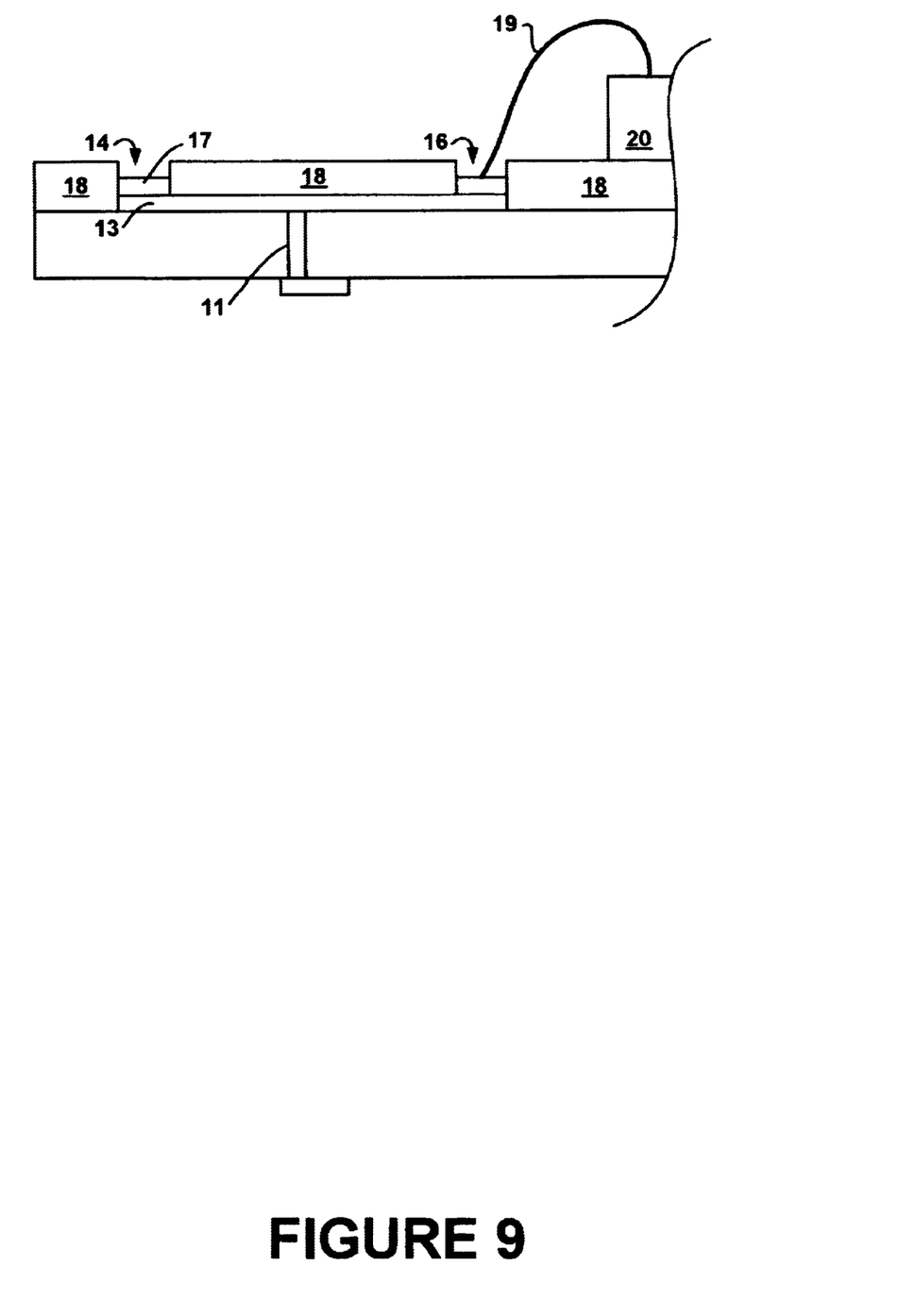
FIG. 9 is a side cross-sectional cut-away view of the structure of FIG. 8 after a semiconductor device has been disposed thereover and after a lead has been used to electrically couple the semiconductor device to a bonding pad in accordance with an embodiment of the present invention.

Continuing with FIG. 2, as shown by step 204, a layer of hard conductive material is formed over bonding pads and over contact pads. More particularly, a material is used that is sufficiently hard to bond a lead to. FIGS. 8–9 show an embodiment of the present invention in which a layer of hard, electrically conductive material 17 is formed over contact pad 14 and bonding pad 16. In the present embodiment, the layer of hard conductive material 17 is formed by selectively depositing a layer of gold and nickel alloy over bonding pad 17 and contact pad 14.

Figure 10:
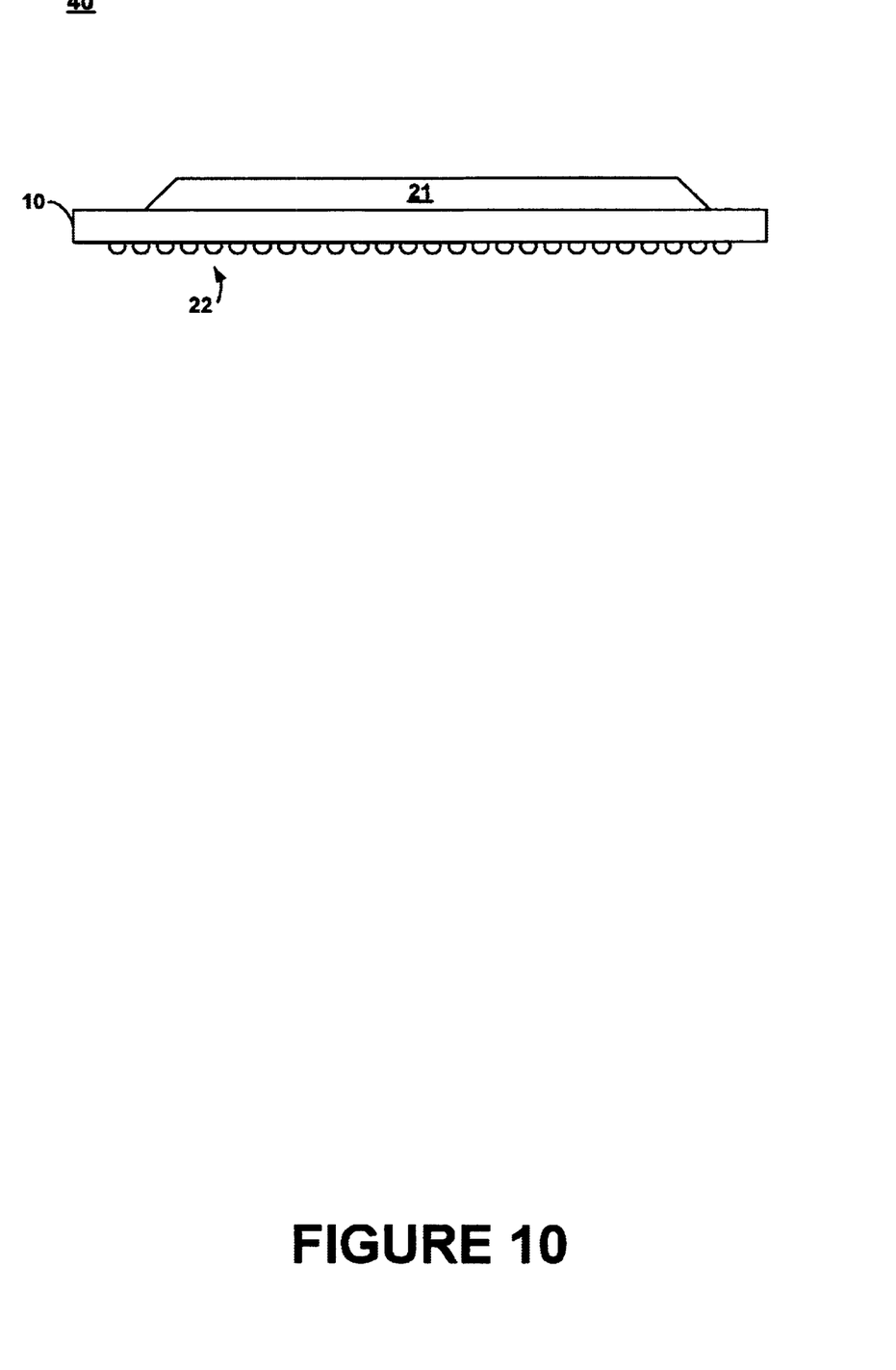
FIG. 10 shows a side view of a completed ball grid array package in accordance with an embodiment of the present invention.

Continuing with FIG. 2, as shown by step 205, the structure of the ball grid array package is then completed. In the present embodiment, the structure is completed by attaching the electrical device, forming a housing over the top of the substrate, disposing conductive balls on the bottom of the substrate and trimming the substrate. In the present embodiment which is shown in FIG. 9, an electrical device 20 that is a semiconductor device is attached using a lead 19 that is thermo-acoustically bonded to hard protective layer 17 so as to electrically couple semiconductor device 20 to bonding pad 16. FIG. 10 shows the structure of FIGS. 3–9 after housing 21 is formed over the top of substrate 10 and after conductive balls 22 have been disposed on the bottom of the substrate so as to form a completed ball grid array package 40.

Figure 11:
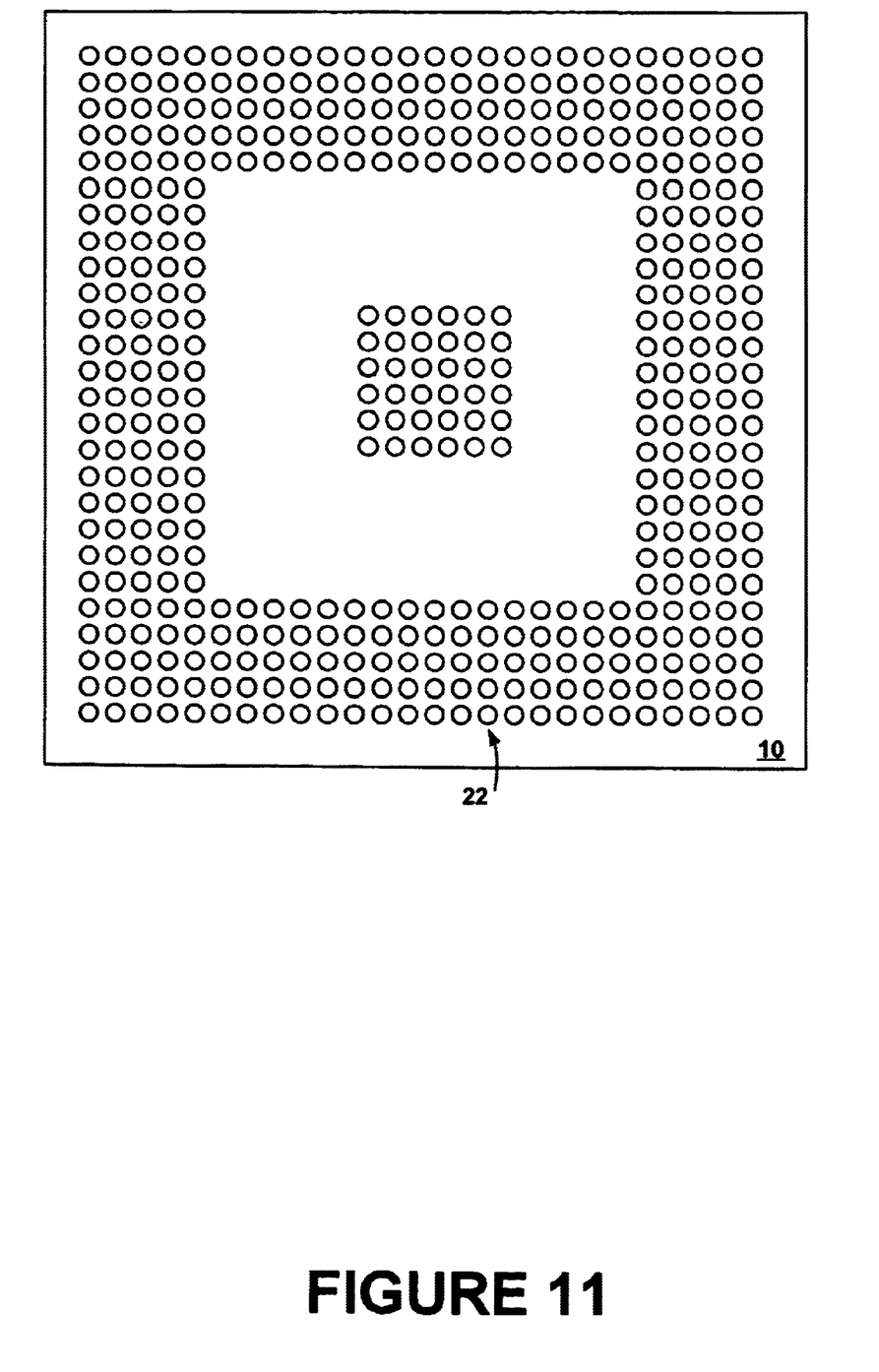
FIG. 11 shows a bottom view of a completed ball grid array package in accordance with an embodiment of the present invention.

FIG. 11 shows a bottom view of ball grid array package 40. It is appreciated that different numbers of conductive balls 22 and different patterns can be used. In addition, any of a number of known methods can be used to form conductive balls 22. In the present embodiment, solder material is used to form conductive balls 22, typically referred to as "solder balls." Also, it is appreciated that conductive balls 22 can be formed at any time after the formation of bonding pads 12 and can be attached either before or after the attachment of housing 21.

Figure 12:
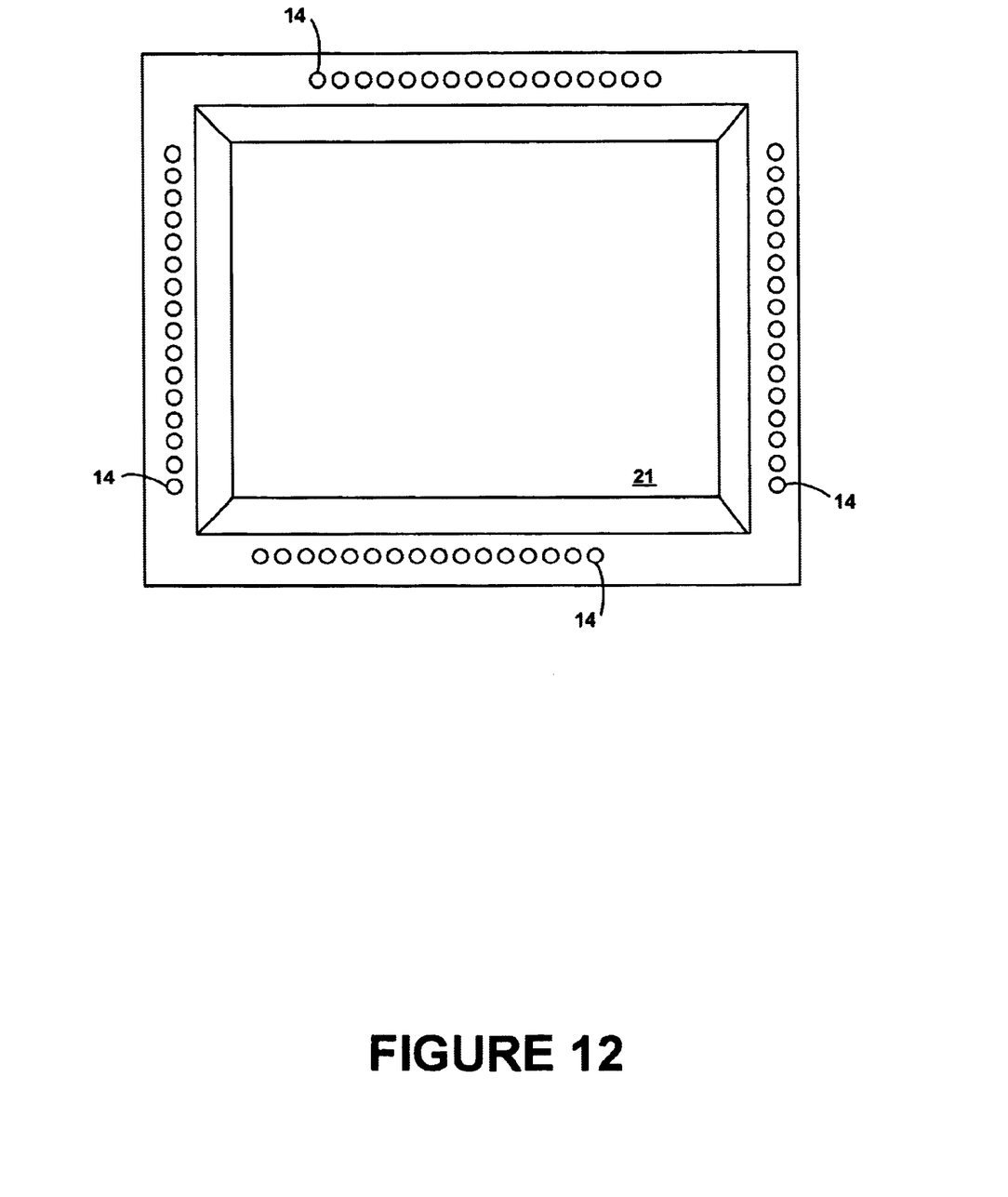
FIG. 12 shows a top view of a completed ball grid array package in accordance with an embodiment of the present invention.

In the embodiment shown in FIG. 12, it can be seen that contact pads 14 are disposed such that they are not covered by housing 21. This leaves contact pads 14 accessible from the top of the ball grid array package. More particularly, contact pads 14 are electrically accessible through contact with the overlying layer of hard conductive material 17 which is exposed on the top surface of ball grid array package 40. Therefore, contact pads 14 are easily accessible via contact with the top surface of ball grid array package 40. In the present embodiment, only some of the bonding pads are coupled to a contact pad. However, it is appreciated that more or fewer contact pads 14 could be used according to the anticipated testing and/or connectivity needs of the packaged electrical device.

The ball grid array package of the present invention can be attached to a circuit board. Once attached to a circuit board, the solder balls make electrical contact with corresponding circuitry disposed on the circuit board so as to electrically couple the electrical device that is disposed within the ball grid array package to the circuit board.

Testing can be easily accomplished while the ball grid array package of the present invention is attached to the circuit board via contact with contact pads 14. More particularly, an electrical testing device can touch contact pads 14 for testing the enclosed electrical device.

Though contact pads 14 are described as being used for testing purposes, contact pads 14 could also be used for coupling to an overlying device or devices. This can be accomplished by disposing a device over ball grid array package 40 and making electrical contact via contact pads 14. In addition, contact pads 14 could be used for electrically connecting with devices that do not overlie ball grid array 40.

The contact pads of the ball grid array package of the present invention are exposed through the solder mask. Therefore, these contact pads are easily accessible as they are exposed on the top of the ball grid array package. Thus, even when the ball grid array is attached to a circuit board, connection with the circuits of the enclosed electrical device can be obtained.

Testing can be easily accomplished while the ball grid array package of the present invention is attached to the circuit board via contact with the exposed contact pads. More particularly, an electrical testing device can touch the contact pads for testing the enclosed electrical device.

The exposed contact pads could also be used for coupling to an overlying device or devices. This can be accomplished by disposing a device over the ball grid array package and by making electrical contact via the exposed contact pads. In addition, the exposed contact pads could be used for electrically coupling to devices that do not overlie the ball grid array package.

Because the ball grid array package of the present invention allows for easy testing via the exposed contact pads in the top of ball grid array package, there is no need to form test pins that extend from the printed circuit board as is required in some prior art applications. Therefore, there are no pins that act as antennas, and no corresponding signal degradation (e.g. reflections, impedance mismatches, etc.) as occurs with prior art devices.

In addition, because the ball grid array package of the present invention allows for easy testing via the exposed contact pads in the top of ball grid array package, there is no need for connecting a testing probe (e.g., an oscilloscope or voltage meter) to leads of other devices (that are electrically connected to the ball grid array) for testing the circuits of the electrical device disposed in the ball grid array package. Therefore, there is no need to include devices with leads in a circuit board design for the purpose of testing an electrical device housed in a ball grid array package as is required in some prior art applications.

Moreover, because the ball grid array package of the present invention allows for easy testing via the exposed contact pads in the top of ball grid array package, circuit boards can be easily designed for high performance data communication. More particularly, ball grid array packages can be included in the circuit board design and prior art features that provide for testing can be eliminated (e.g., test pins that extend from the printed circuit board and devices that include accessible leads), producing a circuit board design that can provide high performance data communication (e.g. data communication signals over 5 gigaHertz (gHz)).

Additionally, the methods of the present invention do not require any additional process steps as compared to prior art ball grid array manufacturing methods. More particularly, contact pads are formed during the conventional step of forming bonding pads and traces on the top of the substrate. Openings that extend above the contact pads are formed in the solder mask during the conventional step of forming openings to expose the bonding pads. Therefore, the methods and apparatus of the present invention provide for connectivity to the enclosed electronic device while not requiring additional process steps as compared to prior art processes. Therefore, the ball grid array housing of the present invention is easily and inexpensively manufactured.

Accordingly, the method and apparatus of the present invention allows for testing of the circuits of a device that is packaged using a ball grid array package. In addition, the method and apparatus of the present invention is effective at high frequencies. Moreover the method and apparatus of the present invention does not contribute to signal degradation.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A ball grid array package for containing an electrical device and comprising:

a plurality of contact pads disposed such that such contact pads are accessible from the top of said ball grid array package, said plurality of contact pads electrically coupled to said electrical device, wherein said contact pads are contactable for testing said electrical device and wherein said electrical device is electrically coupleable to an overlying device by said contact pads;

a non-conducting layer that is disposed over said plurality of contact pads and having openings extending therethrough that overlie said plurality of contact pads for providing electrical access thereto; and a plurality of conductive balls disposed on the bottom of said ball grid array package and electrically coupled to said electrical device.

2. The ball grid array of claim 1 wherein said electrical device further comprises a semiconductor device.

3. The ball grid array package of claim 1 wherein said non-conducting layer further comprises solder mask material.

4. The ball grid array package of claim 1 wherein said non-conducting layer further comprises plastic.

5. The ball grid array package of claim 1 further comprising a plurality of traces that couple to said plurality of contact pads for electrically coupling said plurality of contact pads to said electrical device.

6. The ball grid array package of claim 5 wherein said contact pads comprise copper.

7. The ball grid array package of claim 6 wherein a layer of hard conductive material is deposited over said contact pads.

8. For a ball grid array package that includes a plurality of traces for electrically coupling to an internally disposed electrical device, that includes a non-conducting layer that overlies said traces, and that includes a plurality of conductive balls disposed on the bottom surface thereof, an improvement comprising:

a plurality of contact pads disposed within said ball grid array package and electrically coupled to one of said traces, wherein said contact pads are contactable for testing said electrical device and wherein said electrical device is electrically coupleable to an overlying device by said contact pads; and a plurality of openings disposed within said non-conducting layer, said plurality of openings disposed above said contact pads such that said contact pads are accessible from the top of said ball grid array package for providing electrical access thereto.

9. The improvement of claim 8 wherein said electrical device further comprises a semiconductor device.

10. The improvement of claim 8 wherein said non-conducting layer further comprises solder mask material.

11. The improvement of claim 8 wherein said non-conducting layer further comprises plastic.

12. The improvement of claim 8 further comprising a plurality of traces that couple to said plurality of contact pads for electrically coupling said plurality of contact pads to said electrical device.

13. The improvement of claim 12 wherein said contact pads comprise copper.

14. The improvement of claim 13 wherein a layer of hard conductive material is deposited over said contact pads.

15. A method for forming a ball grid array package for containing a semiconductor device, said method comprising:

a) forming an interconnect structure on a substrate;

b) forming contact pads over the top surface of said substrate, said contact pads electrically coupled to said interconnect structure, wherein said contact pads are disposed in such a way as to be contactable for testing said semiconductor device and wherein said semiconductor device is electrically coupleable to an overlying device by said contact pads;

c) forming a non-conducting layer over said substrate, said non-conducting layer including openings that extend over said contact pads such that said contact pads remain exposed so as to provide electrical access thereto for said testing and by said overlying device;

d) disposing said semiconductor device over said substrate and electrically coupling said semiconductor device to said interconnect structure such that said contact pads are selectively electrically coupled to said semiconductor device; and e) coupling a plurality of conductive balls to the bottom of said substrate such that said conductive balls are electrically coupled to said interconnect structure.

16. The method of claim 15 further comprising the step of:

f) forming a layer of hard conductive material over said contact pads.

17. The method as recited in claim 16 further comprising:

g) disposing a housing over said substrate, said housing overlying said semiconductor device and said housing not overlying said contact pads.

18. The method as recited in claim 17 further comprising:

h) coupling said ball grid array package to a circuit board, said plurality of conductive balls making electrical contact with corresponding circuitry disposed on said circuit board so as to electrically couple said semiconductor device to said circuit board.

19. The method as recited in claim 16 further comprising:

i) coupling to said contact pads using an electrical testing device for testing said semiconductor device.

20. The method as recited in claim 16 further comprising:

j) disposing a device over said ball grid array package and electrically coupling said device to said ball grid array package using said contact pads.

* * * * *